(12) United States Patent
Lin et al.

(10) Patent No.: US 9,406,641 B2
(45) Date of Patent: Aug. 2, 2016

(54) COMPOUND CARRIER BOARD STRUCTURE OF FLIP-CHIP CHIP-SCALE PACKAGE AND MANUFACTURING METHOD THEREOF

(71) Applicant: KINSUS INTERCONNECT TECHNOLOGY CORP., Taoyuan County (TW)

(72) Inventors: Ting-Hao Lin, Taoyuan County (TW); Yi-Fan Kao, Taoyuan County (TW); Shuo-Hsun Chang, Taoyuan County (TW); Yu-Te Lu, Taoyuan County (TW); Kuo-Chun Huang, Taoyuan County (TW)

(73) Assignee: Kinsus Interconnect Technology Corp., Taoyuan County (TW)

( * ) Notice: Subject to any disclaimer, the term of this patent is extended or adjusted under 35 U.S.C. 154(b) by 473 days.

(21) Appl. No.: 13/938,335

(22) Filed: Jul. 10, 2013

(65) Prior Publication Data
US 2015/0014031 A1 Jan. 15, 2015

(51) Int. Cl.
| | |
|---|---|
| *H01L 23/00* | (2006.01) |
| *H01L 23/31* | (2006.01) |
| *H05K 3/46* | (2006.01) |
| *H01L 23/498* | (2006.01) |
| *H05K 1/02* | (2006.01) |
| *H05K 1/18* | (2006.01) |
| *H01L 25/10* | (2006.01) |

(52) U.S. Cl.
CPC ............ *H01L 24/81* (2013.01); *H01L 23/3128* (2013.01); *H01L 23/49833* (2013.01); *H05K 3/4697* (2013.01); *H01L 23/49811* (2013.01); *H01L 23/49816* (2013.01); *H01L 23/49827* (2013.01); *H01L 23/562* (2013.01); *H01L 24/16* (2013.01); *H01L 25/105* (2013.01); *H01L 2224/16225* (2013.01); *H01L 2224/16227* (2013.01); *H01L 2224/73204* (2013.01); *H01L 2224/81191* (2013.01); *H01L 2225/107* (2013.01); *H01L 2225/1023* (2013.01); *H01L 2924/12042* (2013.01); *H01L 2924/15311* (2013.01); *H01L 2924/15787* (2013.01); *H01L 2924/18161* (2013.01); *H01L 2924/3511* (2013.01); *H05K 1/0206* (2013.01); *H05K 1/0271* (2013.01); *H05K 1/183* (2013.01); *H05K 2201/10378* (2013.01); *H05K 2201/10734* (2013.01); *H05K 2203/061* (2013.01)

(58) Field of Classification Search
USPC ........................... 439/330; 205/103; 174/258
See application file for complete search history.

(56) References Cited

U.S. PATENT DOCUMENTS

| | | | | |
|---|---|---|---|---|
| 5,521,435 A * | 5/1996 | Mizukoshi | .............. | H01L 23/24 257/698 |
| 5,835,355 A * | 11/1998 | Dordi | ..................... | H01L 21/563 174/252 |
| 6,396,136 B2 * | 5/2002 | Kalidas | ............. | H01L 23/49816 257/691 |
| 7,894,203 B2 * | 2/2011 | Kariya | .............. | H01L 23/49827 361/763 |
| 2002/0058756 A1 * | 5/2002 | Konarski | .................. | C08F 8/32 525/107 |
| 2003/0100212 A1 * | 5/2003 | Kung | ................... | H05K 3/4038 439/330 |
| 2003/0137056 A1 * | 7/2003 | Taniguchi | ............. | H01L 23/481 257/774 |
| 2006/0202344 A1 * | 9/2006 | Takada | .............. | H01L 23/49822 257/758 |

* cited by examiner

*Primary Examiner* — Timothy Thompson
*Assistant Examiner* — Krystal Robinson
(74) *Attorney, Agent, or Firm* — Rosenberg, Klein & Lee

(57) ABSTRACT

A compound carrier board structure of Flip-Chip Chip-Scale Package and manufacturing method thereof provides a baseplate having a flip region with a through-opening and bonding to a Non-conductive Film to bond to a carrier board in order to form a compound carrier board structure. The baseplate is constructed with a low Thermal Expansion Coefficient material.

8 Claims, 6 Drawing Sheets

COMPOUND CARRIER BOARD STRUCTURE OF FLIP-CHIP CHIP-SCALE PACKAGE AND MANUFACTURING METHOD THEREOF

BACKGROUND OF THE INVENTION

1. Field of the Invention

The invention relates to a compound carrier board structure of Flip-Chip Chip-Scale Package, and more particularly to a compound carrier board structure for enhancing mechanical strength and strengthen heat dissipation.

2. Description of the Related Art

There are two conventional methods for manufacturing Flip-Chip Chip-Scale Package as shown in FIGS. 1A to 1D and 2A to 2D. The Flip-Chip Chip-Scale Package, a three dimension package technology strides toward high-power, high-density and lightweight miniaturized to meet the demand for communication products. Basically, the manufacturing method can be divided into two stages, carrier board stage and package stage. When a die is formed to be a package structure after the two stages, the package structure can be a main structure of a package-on-package, up or down connecting to other package structure or printed circuit boards.

With the referenced to FIGS. 1A to 1D, the package stage of the Flip-Chip Chip-Scale Package comprises:

b) providing at least one die 14 having an active surface 141 and a non-active surface 142; providing a plurality of dumps 143 arranged at the active surface 141 and bonded to the first contact point 11; reflowing the carrier board 10 with die 14 through a flux for fixing the die 14 on the carrier board 10; removing the flux after finishing reflowing and utilizing capillary to underfill a primer 15 between the die 14 and the carrier board 10;

c) providing a first ball 16 mounted to the second contact point 12; over laying the first ball 16 and the die 14 by a package molding material 17 for package molding;

d) providing a second ball 18 mounted to the third contact point 13 and conducting Through Mild Via at a predetermined position of the package molding material 17 by laser for presenting an exposed state at a top of the first ball 16.

With the referenced to FIGS. 2A to 2D, the package stage of the Flip-Chip Chip-Scale Package comprises:

a) providing a carrier board 10 larger or equaling to 150 um having a plurality of first and second contact points 11, 12 at an upper surface thereof and a third contact point 13 at a lower surface thereof; having the second contact point 12 located around the first contact points 11 and planting a first ball 16 at the second contact point 12;

b) providing at least one die 14 having an active surface 141 and a non-active surface 142; providing a plurality of dumps 143 arranged at the active surface 141 and bonded to the first contact point 11; reflowing the carrier board 10 with die 14 through a flux for fixing the die 14 on the carrier board 10 and removing the flux after finishing reflowing;

c) providing package molding material 17 over laying the first ball 16 and bonding to both sides of the die 14 and between the die 14 and the carrier board 10 to present an exposed state at an upper surface of the die 14 for package molding;

d) providing a second ball 18 mounted to the third contact point 13 and conducting Through Mild Via at a predetermined position of the package molding material 17 by laser for presenting an exposed state at a top of the first ball 16.

The above two manufacturing methods of the Flip-Chip Chip-Scale Package use the Through Mild Via structure as the mainstream of the Flip-Chip Chip-Scale Package products. Due to the supporting action while reflowing and the warpage problems of the carrier board 10, the core thickness of the carrier board 10 requires more than 150 um, resulting in the fact that the total thickness of the carrier board 10 cannot be reduced and therefore the Through Mild Via structure formed by the method of the Flip-Chip Chip-Scale Package hinders the total thickness of the package products of the Package-on-Package from continuously declining, being unable to meet future demands of miniaturization. Therefore, there is also room for improvement.

SUMMARY OF THE INVENTION

It is a primary object of the present invention to provide a compound carrier board structure to enhance the mechanical strength and reduce warpage problems of the carrier board.

It is another object of the present invention to provide a baseplate for strengthening the heat dissipation of the compound carrier board structure in order to reduce warpage problems of the carrier board.

In order to achieve the above objects, the compound carrier board structure of Flip-Chip Chip-Scale Package includes a carrier board having a plurality of first and second contact points, at an upper surface thereof and the second contact point located around the first contact point; and a baseplate having a plurality of electrical conductive bodies passing therethrough and a flip region with a through-opening, and the electrical conductive bodies having upper and lower ends exposed at an upper surface and lower surface of the baseplate and respectively electrically connected to lower surfaces of a plurality of first electrode pads and upper surfaces of a plurality of second electrode pads; a Non-conductive Film having an upper surface bonded to the lower surface of the baseplate; the second electrode pad having a lower surface corresponding to a position of the second contact point electronically connected to the second contact point and the first contact point corresponding to a position of the flip region located in the flip region; the Non-conductive Film having a lower surface bonded to the upper surface of the carrier board.

Base on the features disclosed, the electrical conductive body is in a through-hole shape which is a symmetrical frustum having wider upper and lower ends, and the baseplate is formed by a combination of a first layer and a second layer. The electrical conductive body further has an upper conductor in a blind-hole shape, a middle conductor in a buried-hole shape and a lower conductor in a blind-hole shape. Both of the upper conductor and middle conductor are located at the first layer and the lower conductor is located at the second layer. Further, the electrical conductive body has first conductor in a blind-hole shape and a second conductor in a semi-through-hole shape and the first conductor is located at the first layer and the second conductor is located across the first and second layers.

The compound carrier board structure of Flip-Chip Chip-Scale Package further comprising at least a die having corresponding active surface and non-active surface, the active surface having a plurality of dumps connected to the first contact point and a sealant material filled in a gap between the flip region and the die for fixing the die to the flip region to form an exposed state of the non-active surface.

A manufacturing method of the compound carrier board structure of Flip-Chip Chip-Scale Package comprises the steps of: a) providing a carrier board having a plurality of first and second contact points at an upper surface thereof and having the second contact point located around the first contact point; and b) providing a baseplate having a plurality of electrical conductive bodies passing therethrough and a flip region with a through-opening; having the electrical conductive bodies including upper and lower ends exposed at an upper surface and lower surface of the baseplate and respectively electrically connected to lower surfaces of a plurality of first electrode pads and upper surfaces of a plurality of second electrode pads; providing a Non-conductive Film having an upper surface bonded to the lower surface of the baseplate; aligning a position of the second contact point for a lower surface of the second electrode pad electronically connecting to the second contact point; aligning a position of the flip region for the first contact point being located in the flip region; and bonding a lower surface of the Non-conductive Film to the upper surface of the carrier board.

Based on the features disclosed, the manufacturing method of the compound carrier board structure of Flip-Chip Chip-Scale Package further comprising a step of c) providing at least a die having corresponding active surface and non-active surface, providing a plurality of dumps arranged at the active surface and connected to the first contact point, filing a sealant material in a gap between the flip region and the die for fixing the die in the flip region to form an exposed state of a surface of the non-active surface.

The present invention provides a baseplate having heat-dissipation function and conduction and lap joint functions through the first and second electrode pads of the electrical conductive body, reducing modeling paste through-hole process. The film region of the baseplate also has heat-dissipation function. The carrier board, Non-conductive Film baseplate and carrier board together form the compound structure with mechanical strength. When the diet is planted in the film region to conduct the package process, it is difficult to cause the warpage problems of the thin carrier board, achieving thin type and heat strengthening and enhancing the mechanical strength.

DETAILED DESCRIPTION OF THE PREFERRED EMBODIMENT

Referring to FIGS. 3A through 3D, a compound carrier board structure of Flip-Chip Chip-Scale Package and manufacturing method thereof in accordance with the present invention is divided into two stages: a carrier board process and a package process.

Figure 1A:
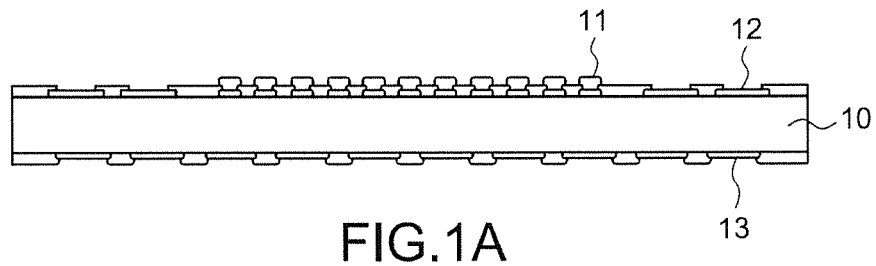
FIG. 1A is a schematic view of a conventional carrier board.
Figure 1B:
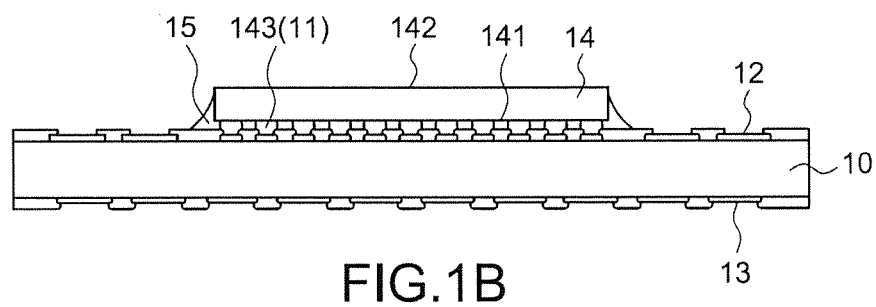
FIG. 1B is a schematic view of a conventional mounted die.
Figure 1C:
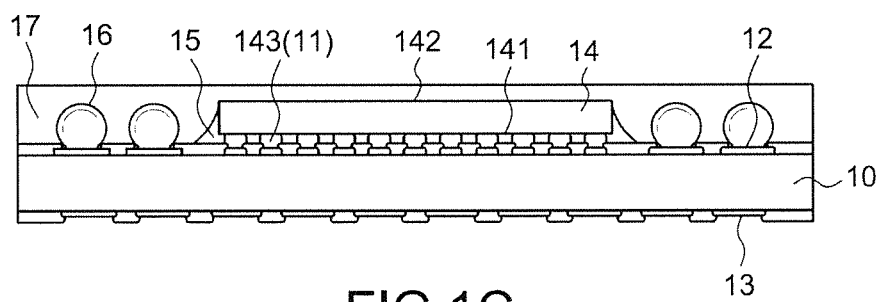
FIG. 1C is a schematic view of a conventional package molding.
Figure 1D:
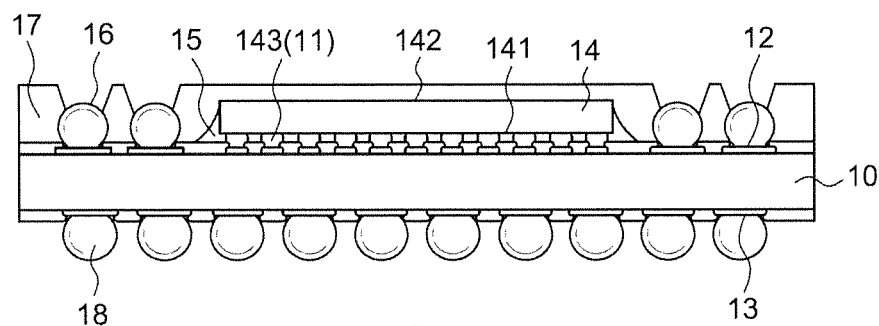
FIG. 1D is a schematic view of a conventional laser Through Mold Via.
Figure 2A:
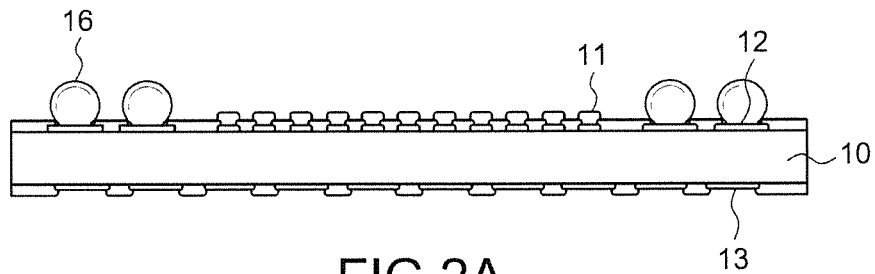
FIG. 2A is a schematic view of a conventional carrier board with ball-planting in advance.
Figure 2B:
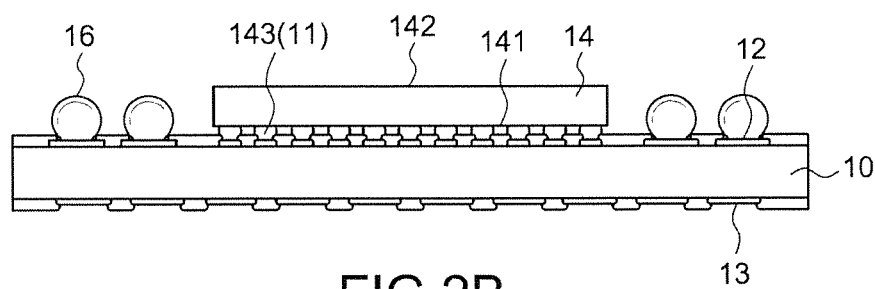
FIG. 2B is a schematic view of a conventional mounted die.
Figure 2C:
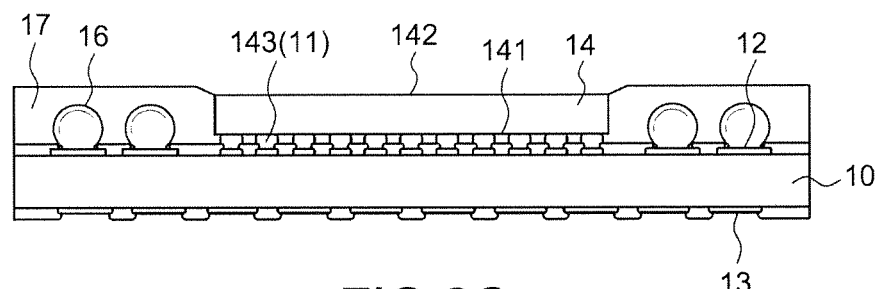
FIG. 2C is a schematic view of a conventional package molding.
Figure 2D:
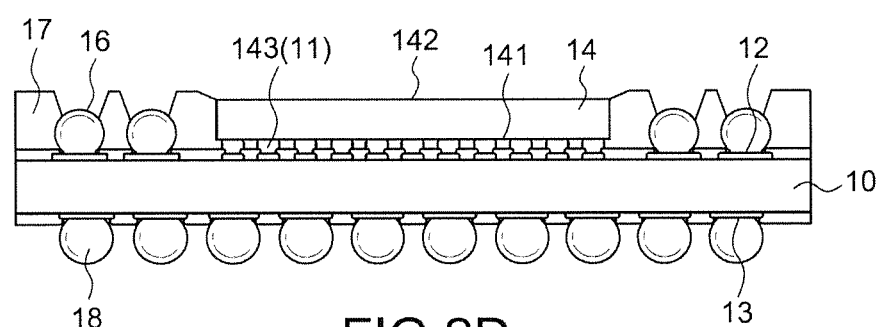
FIG. 2D is a schematic view of a conventional laser Through Mold Via.
Figure 3A:
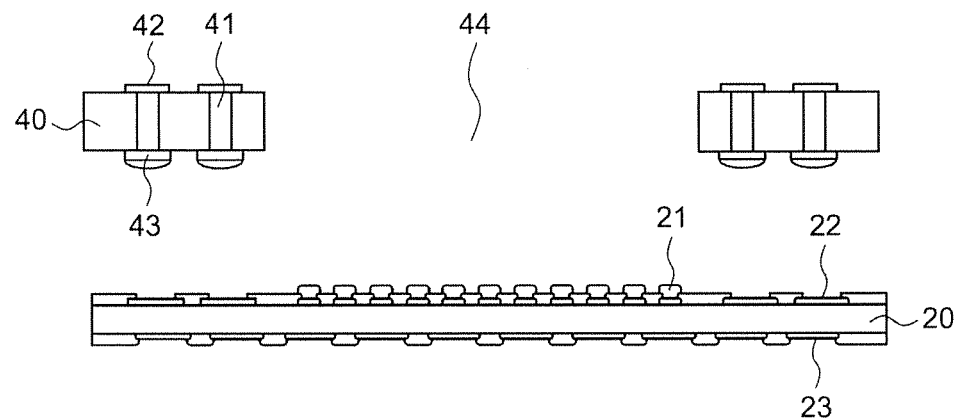
FIG. 3A is a schematic view of a carrier board and a baseplate before combination in accordance with the present invention.
Figure 3B:
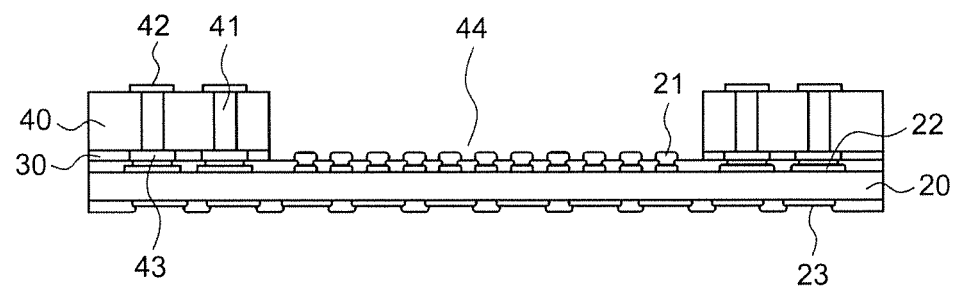
FIG. 3B is a schematic view of a carrier board and a baseplate after combination in accordance with the present invention.

With the referenced to FIGS. 3A and 3B, a carrier board and a baseplate before and after combination belongs to the carrier board process, comprising:

a) providing a carrier board having a plurality of first and second contact points 21, 22 at an upper surface thereof and a plurality of contact points 23 at a lower surface thereof and having the second contact point 22 located around the first contact point 21; and b) providing a baseplate 40 having a plurality of electrical conductive bodies 41 passing therethrough and a flip region 44 with a through-opening; having the electrical conductive bodies 41 including upper and lower ends respectively exposed at an upper surface and lower surface of the baseplate 40 and electrically connected to lower surfaces of a plurality of first electrode pads 42 and upper surfaces of a plurality of second electrode pads 43; providing a Non-conductive Film 30 having an upper surface bonded to the lower surface of the baseplate 40; aligning a position of the second contact point 22 for a lower surface of the second electrode pad 43 electronically connecting to the second contact point 22; aligning a position of the flip region 44 for the first contact point 21 being located in the flip region 44; and bonding a lower surface of the Non-conductive Film 30 to the upper surface of the carrier board 20.

Figure 3C:
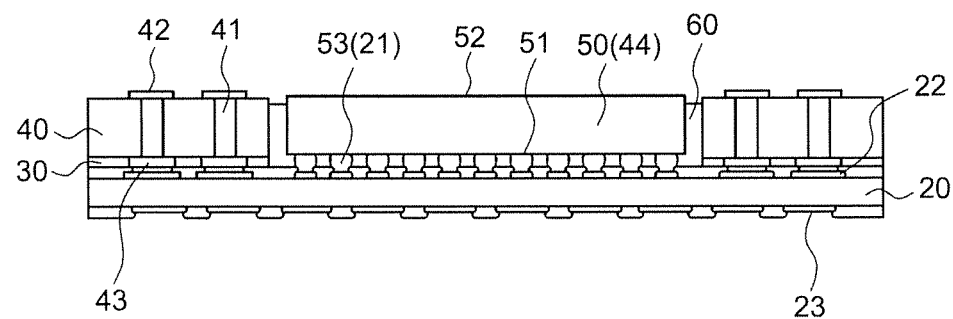
FIG. 3C is a schematic view of package molding in accordance with the present invention.
Figure 3D:
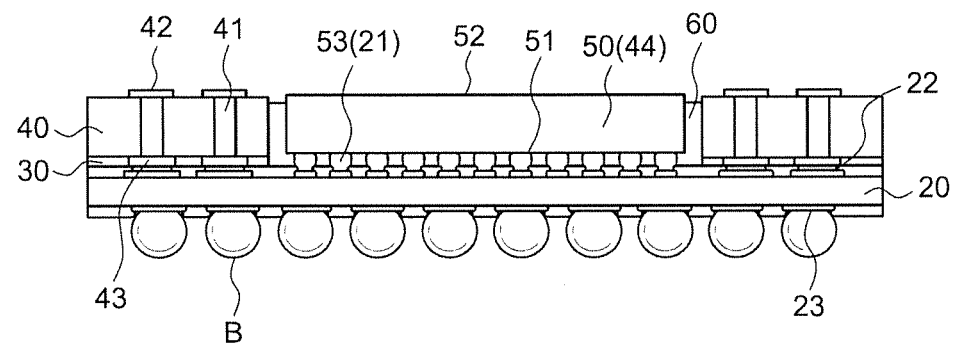
FIG. 3D is a structure schematic view of an applicable embodiment in accordance with the present invention.

With the referenced to FIGS. 3C and 3D, a package molding and structure belongs to the package process, comprising:

c) providing at least a die 50 having corresponding active surface 51 and non-active surface 52, providing a plurality of dumps 53 arranged at the active surface 51 and connected to the first contact point 21, filing a sealant material 60 in a gap between the flip region 44 and the die 50 for fixing the die 50 in the flip region 44 to form an exposed state of the non-active surface 52 and providing a solder ball B mounted to the third contact point 23.

In the embodiment, the compound carrier board structure has a mechanical strength after the carrier board process, comprising a carrier board 20 having a plurality of first and second contact points 21, 22 at an upper surface thereof and a plurality of third contact points 23 at a lower surface thereof, and the second contact point 22 located around the first contact point 21; and a baseplate 40 having a plurality of electrical conductive bodies 41 passing therethrough and a flip region 44 with a through-opening, and the electrical conductive bodies 41 having upper and lower ends respectively exposed to an upper surface and lower surface of the baseplate 40 and electrically connected to lower surfaces of a plurality of first electrode pads 42 and upper surfaces of a plurality of second electrode pads 43; a Non-conductive Film 30 having an upper surface bonded to the lower surface of the baseplate 40; the second electrode pad 43 having a lower surface corresponding to a position of the second contact point 22 electronically connected to the second contact point 22 and the first contact point 21 corresponding to a position of the flip region 44 located in the flip region 44; the Non-conductive Film 30 having a lower surface bonded to the upper surface of the carrier board 20.

In the embodiment, the material of the baseplate 40 is low Coefficient of Thermal Expansion and may be a carbon composite substrate or ceramic substrate for the thin carrier board 20 below 150 um being less susceptible to the thermal stress, leading to warpage problems during the package process. A die 50 implanted into the flip region 44 of the compound carrier board structure has corresponding active surface 51 and non-active surface 52. The active surface 51 has a plurality of dumps 53 connected to the first contact point 21 and a sealant material 60 is filled in a gap between the flip region 44 and the die 50 for fixing the die 50 to the flip region 44 to form an exposed state of the non-active surface 52. Further, a solder ball B is mounted to a third contact point 23.

Figure 4:
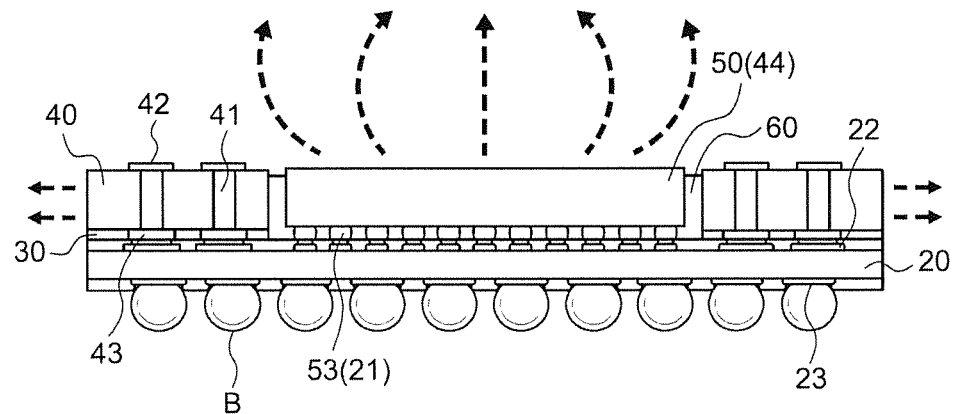
FIG. 4 is a schematic view of the thermal conduction and convention of a packaging die in accordance with the present invention.

With the referenced to FIG. 4, when the die 50 accepts a hot-pressing of the package process, the heat is generated in the flip region 44. The baseplate 40 with low Coefficient of Thermal Expansion is able to withstand the thermal stress caused by the thermal conduction to avoid a thermal expansion arising from the thermal convection focused on the carrier board 20 while the baseplate 40, Non-conductive Film 30 and compound structure strength of carrier board 20 are able to withstand the thermal stress. At the same time, an open area above the flip region 44 is able to accelerate the thermal convection. Thus, through the good thermal conduction and convection, the heat generated from the carrier board 20 during the package process can be rapidly eliminated, solving the warpage problems of the carrier board 20 results from the thermal stresses.

In a first applicable embodiment, the baseplate 40 may be a dot-matrix board not only providing a single layer but multiple layers by using different materials. Through a drill and laser processing, the baseplate 40 provides shapes of through holes, blind holes, buried holes, semi-through holes and etc. therein and the electrical conductive bodies 41 are filled in the different holes by electroplating method. The electrical conductive body 41 may be a copper structure to present a void-free state and therefore the electrical conductive body 41 may be in a through-hole shape, blind-hole shape, buried-hole shape or semi-through-hole shape to conduct different combinations for the baseplate 40 presenting different structures but it is not a limitation.

Figure 5:
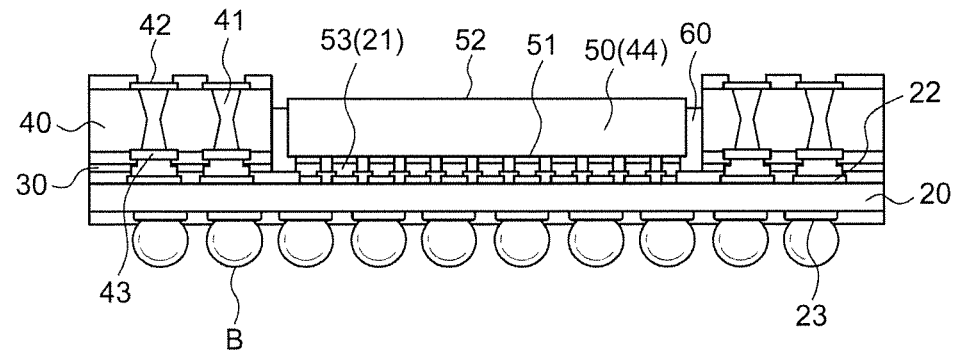
FIG. 5 is a structure schematic view of a first applicable embodiment in accordance with the present invention.

In a second applicable embodiment as shown in FIG. 5, the through-hole shape of the electrical conductive body 41 is a symmetrical frustum having wider upper and lower ends.

Figure 6:
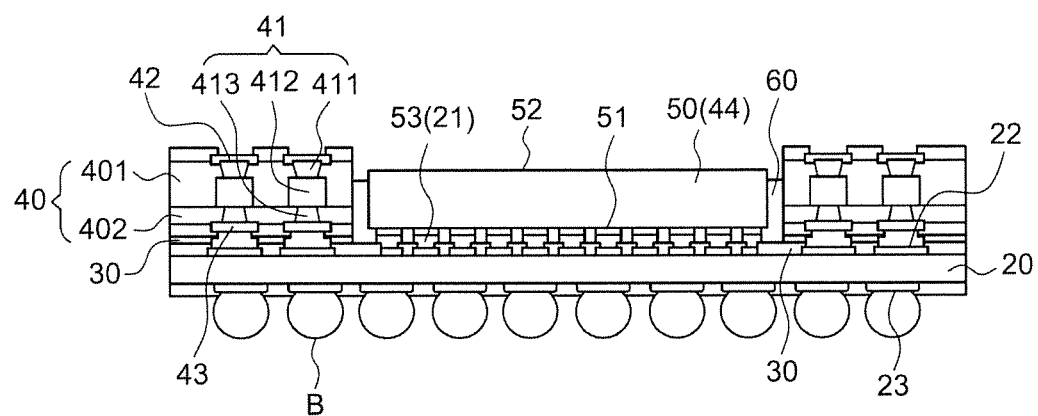
FIG. 6 is a structure schematic view of a second applicable embodiment in accordance with the present invention.

In a third applicable embodiment as shown in FIG. 6, the baseplate 40 is formed by a combination of a first layer 401 and a second layer 402. The electrical conductive body 41 has an upper conductor 411 in a blind-hole shape, a middle conductor 412 in a buried-hole shape and a lower conductor 413 in a blind-hole shape; both of the upper conductor 411 and middle conductor 412 are located at the first layer 401 and the lower conductor 413 is located at the second layer 402.

Figure 7:
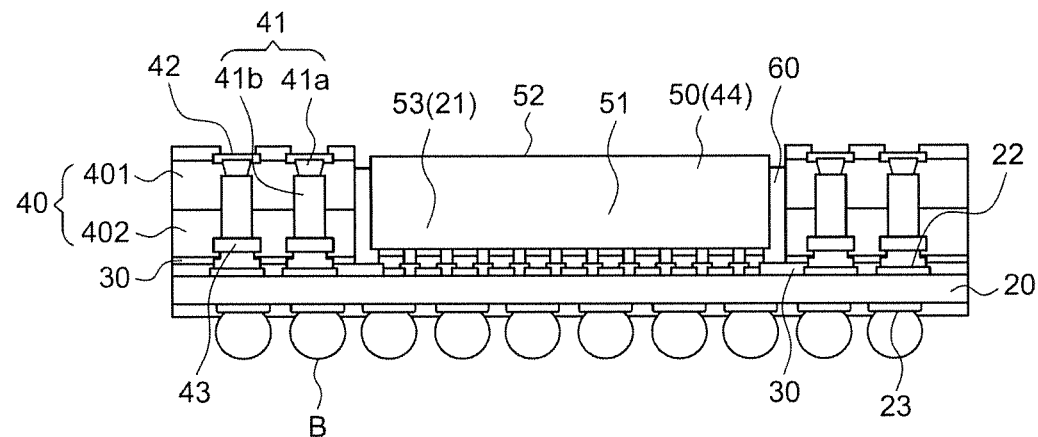
FIG. 7 is a structure schematic view of third applicable embodiment in accordance with the present invention.

In a fourth applicable embodiment as shown in FIG. 7, the electrical conductive body 41 has first conductor 41a in a blind-hole shape and a second conductor 41b in a semi-through-hole shape; the first conductor 41a is located at the first layer 401 and the second conductor 41b is located across the first and second layers 401, 402. The total thickness of the first and second layers 401, 402 is greater than 250 um but it is not a limitation.

Based on the features disclosed, the present invention has following effects:

1. The carrier board 20, Non-conductive Film 30 and baseplate 40 are provided for forming the compound carrier board structure to enhance the mechanical strength and to be a miniaturization for carrier board when conducting the package process with thermal stresses for improve not only the traditional carrier board using a thin core below 150 um to increase layers but for coreless carrier board made by all layer build up method.

2. The baseplate 40 of the dot-matrix board uses the low Thermal Expansion Coefficient material to avoid warpage problems caused by the thermal expansion of the carrier board 20 resulting from the thermal stresses. The carrier board 20 is able to disperse conduction of thermal stresses by the baseplate 40 in order to strengthen cooling effect of the compound carrier board structure.

3. The design of the baseplate 40 not only retains bonding function of Package in Package but also simplify the package process to replace complex Through Mold Via process. In summary, the present invention achieves miniaturization and heat strengthening and enhances the mechanical strength.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A compound carrier board structure of Flip-Chip Chip-Scale Package, comprising:
   a carrier board having a plurality of first and second contact points, at an upper surface thereof and the second contact point located around the first contact point; and
   a baseplate having a plurality of electrical conductive bodies passing therethrough and a flip region with a through-opening, and the electrical conductive bodies having upper and lower ends respectively exposed at an upper surface and lower surface of the baseplate and electrically connected to lower surfaces of a plurality of first electrode pads and upper surfaces of a plurality of second electrode pads; a Non-conductive Film having an upper surface bonded to the lower surface of the baseplate; the second electrode pad having a lower surface corresponding to a position of the second contact point electronically connected to the second contact point and the first contact point corresponding to a position of the flip region located in the flip region; the Non-Conductive film having a lower surface bonded to the upper surface of the carrier board;
   wherein the baseplate is formed by a combination of a first layer and a second layer; and
   wherein the electrical conductive body has an upper conductor in a blind-hole shape, a middle conductor in a buried-hole shape and a lower conductor in a blind-hole shape; both of the upper conductor and middle conductor are located at the first layer and the lower conductor is located at the second layer.

2. The compound carrier board structure of Flip-Chip Chip-Scale Package as claimed in claim 1, wherein the baseplate is a dot-matrix board, baseplate with low Coefficient of Thermal Expansion, carbon composite substrate, or ceramic substrate.

3. The compound carrier board structure of Flip-Chip Chip-Scale Package as claimed in claim 2, further comprising at least a die having corresponding active surface and non-active surface, the active surface having a plurality of dumps connected to the first contact point and a sealant material filled in a gap between the flip region and the die for fixing the die to the flip region to form an exposed state of the non-active surface.

4. A manufacturing method of the compound carrier board structure of Flip-Chip Chip-Scale Package as claimed in claim 1, comprising the steps of:

a) providing a carrier board having a plurality of first and second contact points at an upper surface thereof and having the second contact point located around the first contact point; and b) providing a baseplate having a plurality of electrical conductive bodies passing therethrough and a flip region with a through-opening; having the electrical conductive bodies including upper and lower ends respectively exposed at an upper surface and lower surface of the baseplate and electrically connected to lower surfaces of a plurality of first electrode pads and upper surfaces of a plurality of second electrode pads; providing a Non-conductive Film having an upper surface bonded to the lower surface of the baseplate; aligning a position of the second contact point for a lower surface of the second electrode pad electronically connecting to the second contact point; aligning a position of the flip region for the first contact point being located in the flip region; and bonding a lower surface of the Non-conductive Film to the upper surface of the carrier board;

b1) forming the baseplate by a combination of a first layer and a second layer; and b2) providing the electrical conductive body with an upper conductor in a blind-hole shape, a middle conductor in a buried-hole shape and a lower conductor in a blind-hole shape; both of the upper conductor and middle conductor being located at the first layer and the lower conductor is located at the second layer.

5. The manufacturing method of the compound carrier board structure of Flip-Chip Chip-Scale Package as claimed in claim 4, further comprising a step of c) providing at least a die having corresponding active surface and non-active surface, providing a plurality of dumps arranged at the active surface and connected to the first contact point, filing a sealant material in a gap between the flip region and the die for fixing the die in the flip region to form an exposed state of a surface of the non-active surface.

6. A compound carrier board structure of Flip-Chip Chip-Scale Package, comprising:

a carrier board having a plurality of first and second contact points, at an upper surface thereof and the second contact point located around the first contact point; and a baseplate having a plurality of electrical conductive bodies passing therethrough and a flip region with a through-opening, and the electrical conductive bodies having upper and lower ends respectively exposed at an upper surface and lower surface of the baseplate and electrically connected to lower surfaces of a plurality of first electrode pads and upper surfaces of a plurality of second electrode pads; a Non-conductive Film having an upper surface bonded to the lower surface of the baseplate; the second electrode pad having a lower surface corresponding to a position of the second contact point electronically connected to the second contact point and the first contact point corresponding to a position of the flip region located in the flip region; the Non-Conductive film having a lower surface bonded to the upper surface of the carrier board;

wherein the baseplate is formed by a combination of a first layer and a second layer; and wherein the electrical conductive body has first conductor in a blind-hole shape and a second conductor in a semi-through-hole shape; the first conductor is located at the first layer and the second conductor is located across the first and second layers.

7. The compound carrier board structure of Flip-Chip Chip-Scale Package as claimed in claim 6, wherein the baseplate is a dot-matrix board, baseplate with low Coefficient of Thermal Expansion, carbon composite substrate, or ceramic substrate.

8. The compound carrier board structure of Flip-Chip Chip-Scale Package as claimed in claim 7, further comprising at least a die having corresponding active surface and non-active surface, the active surface having a plurality of dumps connected to the first contact point and a sealant material filled in a gap between the flip region and the die for fixing the die to the flip region to form an exposed state of the non-active surface.

* * * * *